(12) United States Patent
Xu et al.

(10) Patent No.: US 7,943,286 B2
(45) Date of Patent: May 17, 2011

(54) REPRODUCIBLE, HIGH YIELD METHOD FOR FABRICATING ULTRA-SHORT T-GATES ON HFETS

(75) Inventors: Dong Xu, Nashua, NH (US); Gabriel Cueva, Bedford, NH (US); Pane-chane Chao, Nashua, NH (US); Wendell Kong, Hollis, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 569 days.

(21) Appl. No.: 12/079,529

(22) Filed: Mar. 27, 2008

(65) Prior Publication Data

US 2008/0241757 A1    Oct. 2, 2008

Related U.S. Application Data

(60) Provisional application No. 60/920,199, filed on Mar. 27, 2007.

(51) Int. Cl.
*G03F 7/26* (2006.01)

(52) U.S. Cl. ......... 430/313; 430/328; 430/394; 430/330

(58) Field of Classification Search .................. 430/313, 430/328, 329, 394, 330, 311, 312
See application file for complete search history.

(56) References Cited

U.S. PATENT DOCUMENTS

| | | | | |
|---|---|---|---|---|
| 6,051,454 A | * | 4/2000 | Anda et al. | 438/167 |
| 2008/0108188 A1 | * | 5/2008 | Jeong et al. | 438/172 |

* cited by examiner

*Primary Examiner* — Kathleen Duda
*Assistant Examiner* — Caleen O Sullivan
(74) *Attorney, Agent, or Firm* — Daniel J. Long

(57) ABSTRACT

A method for fabricating ultra-short T-gates on heterojunction field effect transistors (HFETs) comprising the steps of (a) providing a coating of three layers of resists, with polymethylmethacrylate (PMMA) with high molecular weight on the bottom, polydimethylglutarimide (PMGI) in the middle, and PMMA with low molecular weight on the top; (b) in a first exposure, exposing and developing the layers with a dose of a developer that is high enough to allow the developer to break the top PMMA but low to avoid contributing significantly to the overall dose received in the bottom PMMA layer; and (c) in a second exposure, using an exposure and developing process to define 0.03-0.05 um openings in the bottom PMMA layer.

4 Claims, 2 Drawing Sheets

REPRODUCIBLE, HIGH YIELD METHOD FOR FABRICATING ULTRA-SHORT T-GATES ON HFETS

CROSS REFERENCE TO RELATED APPLICATION

This application claims rights under 35 USC§119(e) from U.S. application Ser. No. 60/920,199 filed Mar. 27, 2007.

BACKGROUND OF THE INVENTION

1. Field of the Invention

The present invention relates to heterojunction field effect transistors (HFETs) and more particularly to methods for fabricating ultra-short T-gates on HFETs.

2. Brief Description of Prior Developments

Microwave and millimeter wave transistors often utilize shorter gate lengths to improve their performance and increase the frequency of operation. Ultra-short T-gate technology enhances HFET gain and low noise performance for a wide range of military and commercial systems and applications. Typically, T-gate technology employs multiple resist layers with different electron beam sensitivities for subsequent layer developing. This technique has been successfully used in our 0.1 µm HFET process, but becomes difficult to implement for sub-0.1 µm T-gates with good process control or satisfactory yield. Sub-0.1 µm T-gates are very difficult to reproduce in a multiple resist layer scheme because the electron beam's spot size and dose for the lower "stem" or "foot" are broaden by the top resist layers. An improved way to address these fabrication issues is, however, still needed.

SUMMARY OF INVENTION

The novel method of this invention uses a two-step exposure and developing scheme on the basis of a trilayer resist stack. The idea is to first expose and develop the top layers before finally exposing and developing the bottom layer resist. The major benefit of splitting the exposure and developing process into two cycles is the elimination of electron beam broadening as the beam travels through the top resist layers. As a result, the opening in the bottom resist, which defines the gate length, is exposed with a finely focused electron beam, and the ultra-short T-gates are well defined for a gate metal liftoff process. The insertion of polydimethylglutarimide (PMGI) as the middle layer creates a thick, highly sensitive e-beam material with no intermixing with the bottom or top resist layers. Furthermore, the choice of PMGI eliminates any interference between the two developing cycles. Thus, the definition of ultra-short gate length also becomes much more controllable and reproducible. These improvements greatly contribute to an overall high-yield manufacturing process.

BRIEF DESCRIPTION OF THE DRAWINGS

The present invention is further described with reference to the accompanying drawings wherein.

DETAILED DESCRIPTION OF THE PREFERRED EMBODIMENTS

The fabrication of the gate electrode in a transistor is the most critical processing step, which determines the performance of HFETs and HFET-based circuits. The two-step exposure and developing T-gate process is based on a trilayer resist technology and brings significant improvements to those being used presently. The demonstration of the enabling technology has shown (1) the capability to fabricate T-gates with footprints of 0.03 µm without the assistance of a dielectric film, which can degrade high-frequency performance, (2) the flexibility to modify the size and position (e.g. "gamma" gates) of the top portion of the gate without adjusting the parameters for the footprint definition, (3) better process control in terms of critical dimension (CD) and reproducibility, (4) clean gate metal liftoff, leading to a high-yield fabrication process, and (5) easily scalable to large size wafers with little, if any, modification.

Figure 1:
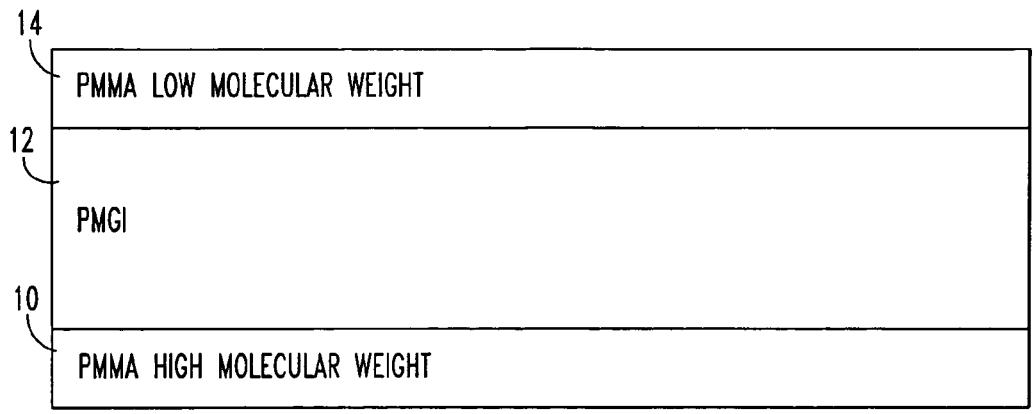
FIGS. 1-3 are schematic drawings showing successive steps in the method of the present invention.
Figure 2:
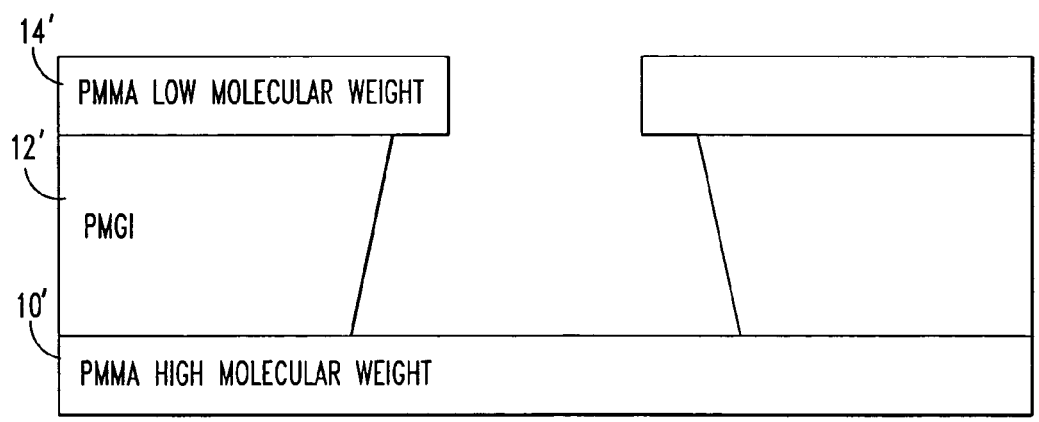
Figure 3:
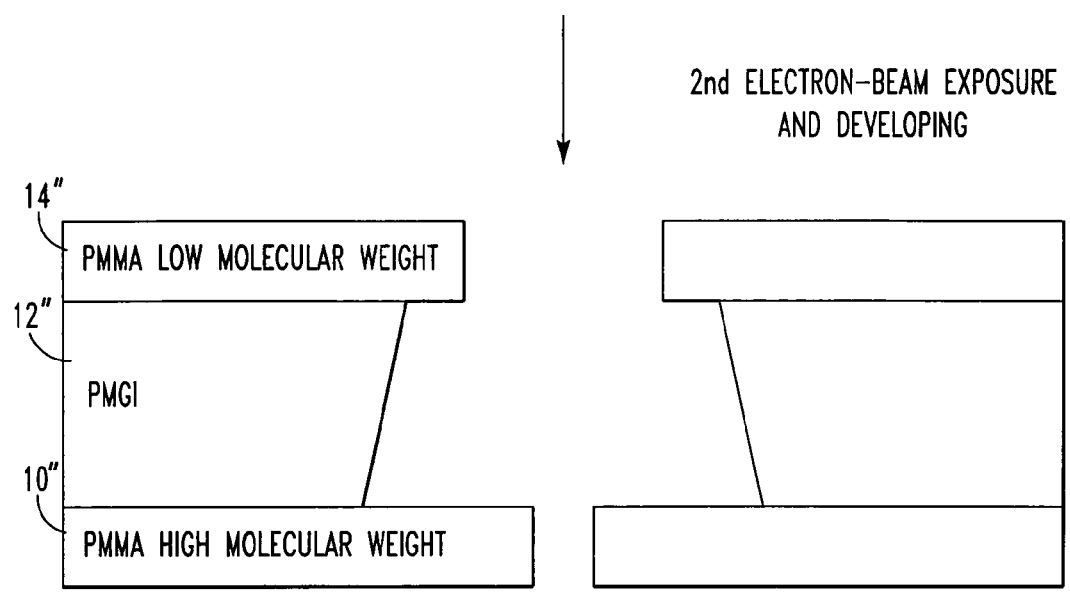

FIGS. 1-3 show the overall process described herein. FIG. 1 shows the resist stack as coated. Referring to FIG. 1, the process starts with the coating of three layers of resists which are polydimethylmethacrylate (PMMA) with high molecular weight 10 on the bottom, PMGI 12 in the middle, and PMMA with low molecular weight 14 on the top of the stack. The thickness of each layer is selected based on their function in the process. Normally, the bottom layer is made thin for the definition of small gate footprint, while the PMGI layer thickness is selected based on the required gate metal thickness for the device performance. The selection of the baking process for each layer is dependent on the desired contrast and solubility in the subsequent developing processes.

FIG. 2 shows the first alignment, first exposure, and developing cycle. Referring to FIG. 2, the first exposure needs to have a dose that is high enough to allow the developer to break the top PMMA 14', but low enough to avoid contributing significantly to the overall dose received in the bottom PMMA layer 10'. After developing the top PMMA layer, another developer, which does not affect the top PMMA or the bottom PMMA, is used to develop the PMGI layer 12'. The developing time is selected to generate enough undercut in PMGI layer, which is the key to allow a clean gate metal lift off.

The realigning, second exposure and developing cycle is illustrated in FIG. 3. Referring to FIG. 3, there is a PMMA high molecular weight layer 10", a PMGI layer 12", and a PMMA low molecular weight layer 14". The key to this step of exposure is to make the dose as concentrated as possible. Normally, a dose that is much higher than the first exposure is selected for this purpose. The developer used for the bottom layer needs to be of high contrast so that an opening as small as 0.03-0.05 µm can be generated.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method for fabricating ultra-short T-gates on heterojunction field effect transistors (HFETs) comprising the steps of:
    (a) providing a coating of three layers of resists, with a polymethylmethacrylate (PMMA) layer with high molecular weight on the bottom, a polydimethylglutarimide (PMGI) layer in the middle, and a PMMA layer with low molecular weight on the top;
    (b) in a first exposure and developing cycle, exposing and developing the layers with a dose that is high enough to allow the developer to break the top PMMA but low to avoid contributing significantly to the overall dose received in the bottom PMMA layer; and (c) in a second exposure and developing cycle, using an exposure and developing process to define 0.03-0.05 um openings in the bottom PMMA layer.

2. The method of claim 1 wherein in step (a) thickness of the bottom PMMA layer with high molecular weight defines a small gate footprint.

3. The method of claim 1 wherein in step (a) thickness of the PMGI layer is selected based on required gate metal thickness.

4. The method of claim 1 wherein in step (a) baking is conducted and baking conditions are selected to provide desired contrast and solubility for subsequent development.

* * * * *